United States Patent
Ma et al.

(10) Patent No.: US 8,513,966 B2
(45) Date of Patent: Aug. 20, 2013

(54) PROBES FORMED FROM SEMICONDUCTOR REGION VIAS

(75) Inventors: Qing Ma, Saratoga, CA (US); Roy E. Swart, Hillsboro, OR (US); Paul B. Fischer, Portland, OR (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 368 days.

(21) Appl. No.: 12/854,697

(22) Filed: Aug. 11, 2010

(65) Prior Publication Data

US 2012/0038379 A1 Feb. 16, 2012

(51) Int. Cl.
*G01R 31/20* (2006.01)
(52) U.S. Cl.
USPC ............. 324/754.03; 324/754.01; 324/754.14
(58) Field of Classification Search
None
See application file for complete search history.

(56) References Cited

U.S. PATENT DOCUMENTS

| | | | |
|---|---|---|---|
| 7,073,938 B2 * | 7/2006 | Gianchandani et al. | 374/185 |
| 7,687,900 B2 * | 3/2010 | Fukamizu et al. | 257/690 |
| 7,733,102 B2 * | 6/2010 | Cheng | 324/762.01 |
| 8,053,878 B2 * | 11/2011 | Iwamura et al. | 257/686 |
| 8,110,477 B2 * | 2/2012 | Lin et al. | 438/393 |
| 2006/0006888 A1 * | 1/2006 | Kruglick et al. | 324/754 |
| 2006/0226535 A1 * | 10/2006 | Antol et al. | 257/698 |
| 2007/0032069 A1 * | 2/2007 | Morgan et al. | 438/624 |
| 2008/0211524 A1 * | 9/2008 | Chen et al. | 324/754 |
| 2009/0298285 A1 * | 12/2009 | Kar-Roy et al. | 438/667 |
| 2010/0134129 A1 * | 6/2010 | Breinlinger et al. | 324/760 |
| 2010/0134131 A1 * | 6/2010 | Chen et al. | 324/761 |
| 2012/0105093 A1 * | 5/2012 | Lee | 324/762.01 |
| 2013/0015440 A1 * | 1/2013 | Dang et al. | 257/48 |

* cited by examiner

*Primary Examiner* — Jermele M Hollington
(74) *Attorney, Agent, or Firm* — Blakely, Sokoloff, Taylor & Zafman LLP

(57) ABSTRACT

Embodiments of the invention describe forming a set of probes using semiconductor regions each including a plurality of vias. A first set of probe segments may be formed from a first set of vias on a first semiconductor region. A second set of probe segments may be formed from a second set of vias on a second semiconductor region and bonded to the first set of probe segments. At least one spring comprising a dielectric material may be formed to couple the first set of probe segments, while a set of metal tips disposed on the second set of probe segments.

10 Claims, 6 Drawing Sheets

PROBES FORMED FROM SEMICONDUCTOR REGION VIAS

FIELD

Embodiments of the invention generally pertain to electronic devices, and more particularly to electrical probes fabricated using sets of vias, each set of vias included in a semiconductor region.

BACKGROUND

A variety of interconnect structures may be used to provide access to signals of a semiconductor die. Solder bumps are one type of interconnect structure. Solder bumps are disposed over contact pads that are located within an active area of the die. The number of solder bumps that may be placed on a semiconductor die is determined by the size of the active area and the achievable fineness of the bump pitch—i.e., the width of a solder bump and the spacing between adjacent solder bumps. As semiconductor die become more complex and the corresponding active area reduces in size, bump density must increase in order to provide access to the signals of the die.

Signals accessible via solder bumps are accessed by connectors such as probes. To access a plurality of solder bumps of a semiconductor die, the pitch of the probes must correspond to the bump pitch of the die. There are currently no probe solutions suitable for solder bumps with pitches of less than 100 μm. Using prior art methods to form probes of this pitch (i.e., width) would produce probes subject to buckling, overheating due to current density and structural fatigue. What is needed is a probe solution with the mechanical and electrical integrity capable of being used for increasing bump densities and narrowing bump pitches.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as a discussion of other potential embodiments or implementations of the inventive concepts presented herein. An overview of embodiments of the invention is provided below, followed by a more detailed description with reference to the drawings.

DESCRIPTION

Embodiments of the invention are directed towards probes formed using vias included in semiconductor regions (e.g., a wafer). Vias are capable of being formed on wafers having dimensions and spacing that are comparable to solder bumps with small pitches (e.g., less than 100 um). Thus, by utilizing vias, probe solutions may be made that are suitable for increasing bump densities and narrowing bump pitches.

Embodiment of the invention further provide for probes comprising materials of high mechanical and electrical integrity. Prior art solutions typically involve coating probes with some materials to enhance mechanical and electrical integrity, but said coating is subject to wear with regular use. It is to be understood in view of the description below that the probes formed using materials according to embodiments of the invention require no additional coating, and thus are not subject to the wear and degradation limitations of prior art solutions.

Embodiments of the invention further allow for gaps between probes to be smaller, without sacrificing probe thickness. This enables large electrical current to flow through the probe without concerns for electrical shorting. Probe thickness further allows for the reduced likelihood of probe buckling due to the enhanced structural integrity provided by embodiments of the invention.

Embodiments of the invention further allow for the creation of springs in between each probe to affect lateral movements of individual probes included in a plurality of probes. Springs may vary in structure depending on the distance between the spring and the probe tip. For example, springs may allow for greater lateral movement close to the probe tips, and may be more restrictive of lateral movement close to the probe bases.

Figure 1:
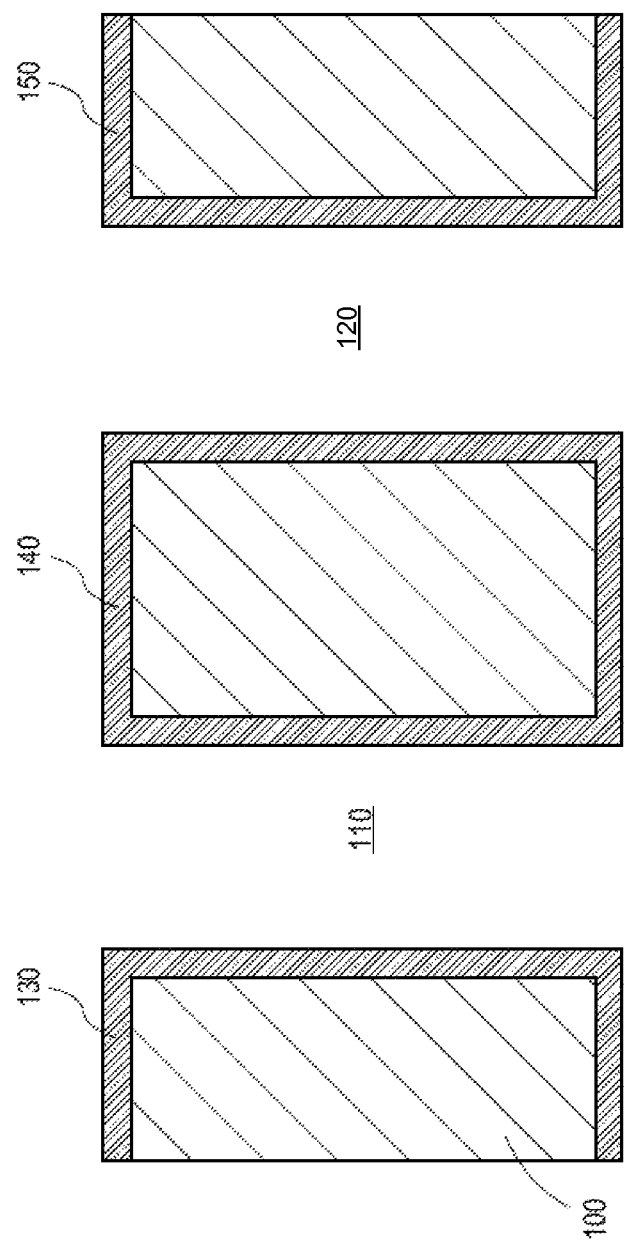
FIG. 1 is a block diagram of a semiconductor region utilized by an embodiment of the invention.

FIG. 1 is a block diagram of a semiconductor region utilized by an embodiment of the invention. Vias 110 and 120 may be formed on semiconductor region 100. The thickness of semiconductor region 100 may be, for example, between 50 and 200 μm, with vias 110 and 120 formed at a pitch of less than 100 μm.

In one embodiment, semiconductor region 100 is included in a semiconductor wafer, said wafer including far more vias than illustrated herein. Semiconductor region 100 may further comprise any material, e.g., silicon or glass, suitable for the operations described below—including the subsequent removal of said material to expose the filled vias described below. Because semiconductor region 100 is to be removed, it may be referred to herein as or being included in a "sacrificial wafer."

A variety of processes may be used to form vias 110 and 120—e.g., a mechanical etching process, a chemical etching process, a plasma etching process, or a photo-chemical etching process.

A dielectric material may be deposited on the surface of wafer 100, including the interior of vias 110 and 120, to form dielectric layers 130, 140 and 150. It will be understood in viewing the figures and description below that dielectric layers 130, 140 and 150 will form a "spring" after removal of the sacrificial wafer. Thus, the dielectric material may comprise any material suitable to function as a spring disposed between probes, including silicon nitride (SiN), silicon carbonate (SiC), Aluminum oxide (Al2O3), CVD diamond, and silicon oxide (SO2) (although SO2 is not as mechanically strong as the other examples).

Figure 2A:
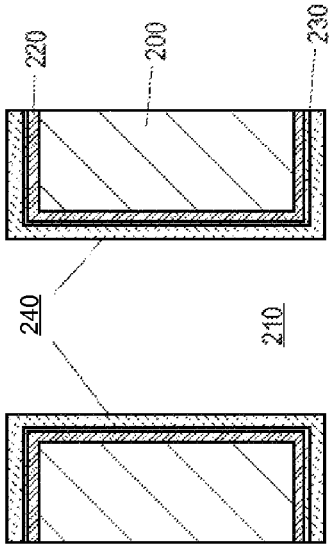
FIGS. 2a-2d are block diagrams of a series of processing steps of wafer vias according to an embodiment of the invention.

FIGS. 2a-2d are block diagrams of a series of processing steps of wafer vias according to an embodiment of the invention. In FIG. 2a, Wafer 200, including via 210 and dielectric layer 220, may be plated with seed layer 230 using any means known in the art. For example, an electroless plating process may be used, in which a complex chemical solution is deposed on wafer 200 and deposition happens spontaneously on the wafer, forming a high electrochemical potential with the solution. A sputtering process may also be used to deposit seed layer 230. Sputtering involves releasing a material from a source at a temperature lower than evaporation. Wafer 200 may then be placed in a vacuum chamber and an inert gas would be introduced at low pressure. Ions of an ionized gas would then be accelerated towards the surface of the wafer 200, causing atoms to break off in vapor form and condense on all surfaces, thereby forming seed layer 230.

Figure 2B:
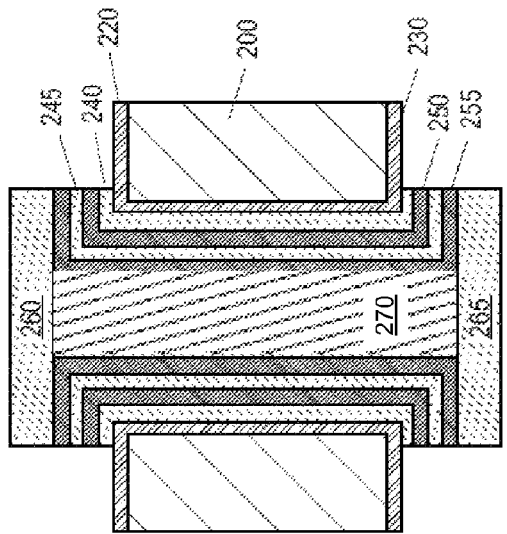

FIG. 2b illustrates portions of wafer 200 including via 210 plated with metal and adhesion layer 240 to block oxygen. In one embodiment, metal layer 240 comprises gold (Au) and the adhesion layer comprises nitride.

Figure 2C:
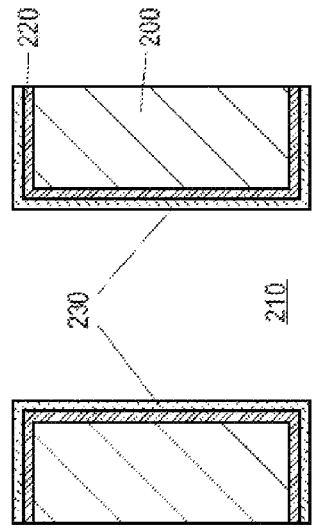

FIG. 2c illustrates structural metal layer 250 formed on wafer 200 and inside via 210. In one embodiment, metal layer 250 is formed from a Chemical Vapor Deposition (CVD) process, which involves a chemical reaction product producing solid material with condenses on the surface of wafer 200. Metal layer 250 may comprise a structurally sound metal that is able to withstand high temperatures. For example, metal layer 250 may be Titanium Aluminide (TiAl3), Tungsten (W), or Platinum-Iridium (Pt/Ir).

Figure 2D:
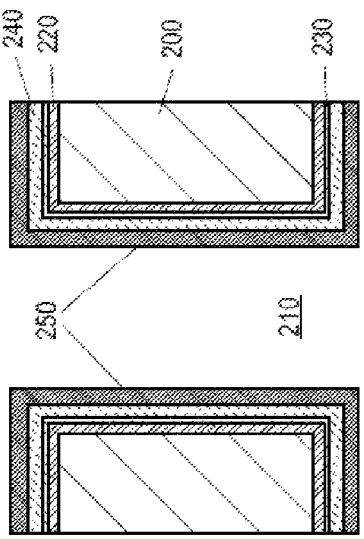

FIG. 2d illustrates wafer 200 with additional plate layer 245 and structural layer 255, formed by any process previously described. Layers 240, 245, 250 and 255 may be patterned to align with bonding pads 260 and 265. In this example, boding pads 260 and 265 comprise gold. Via 210 is filled to form metal core 270. In this embodiment, metal core 270 comprises a copper core.

Figure 3:
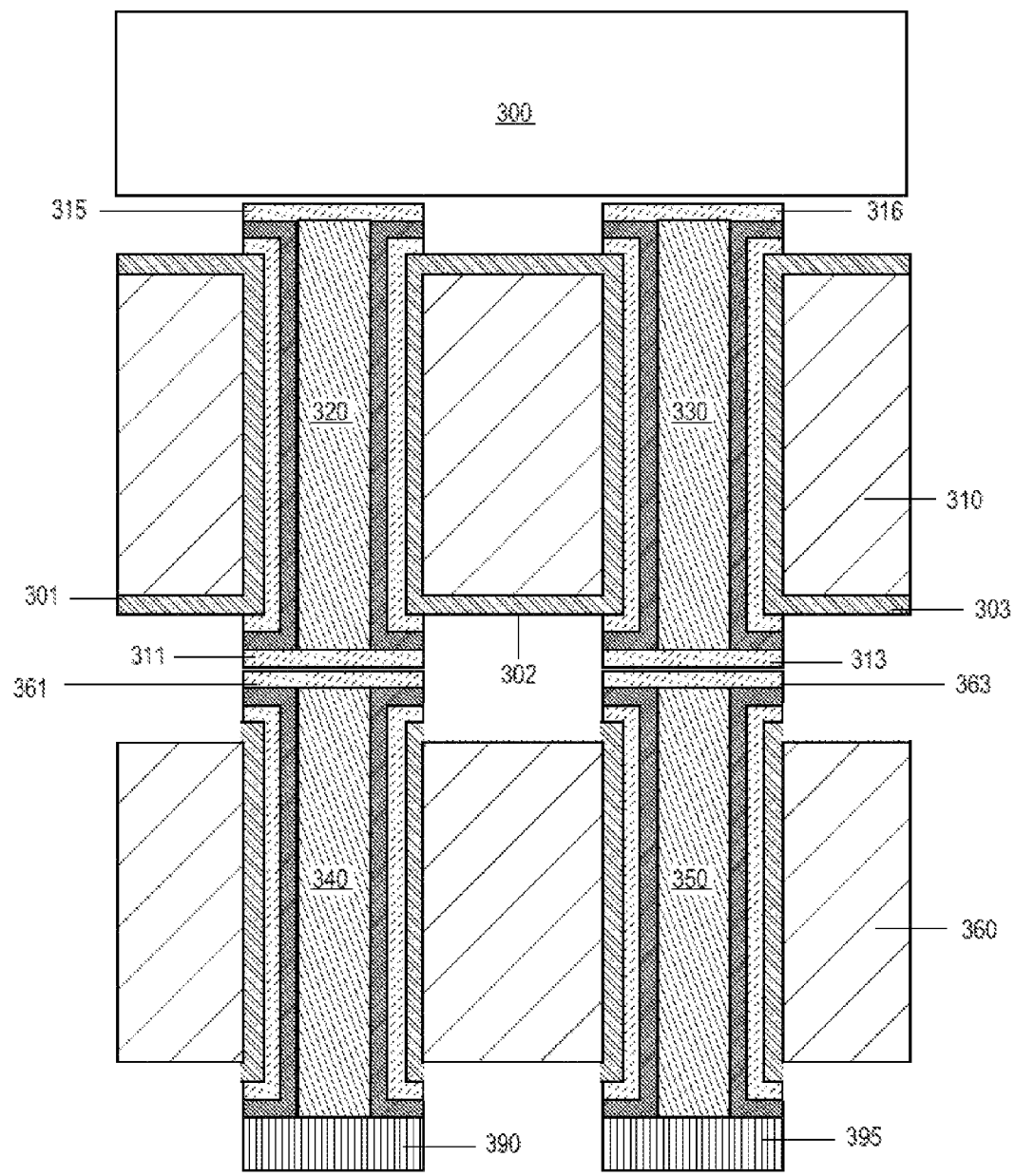
FIG. 3 illustrates a set of probes formed from vias included in semiconductor regions.

FIG. 3 illustrates a set of probes formed from vias included in semiconductor regions. Regions 310 and 360 each contain a plurality of vias, 320 and 330, and 340 and 350 respectively. In this embodiment, the vias of semiconductor regions 310 and 360 are aligned and bonded together via bonding pads 311/361 and 313/363.

In this embodiment, vias 320 and 330 of wafer 310 are coupled to substrate 300 via boding pads 315 and 316. Vias 340 and 350 are coupled to probe tips 390 and 395 respectively. Said probe tips are to be used for contacting each probe to a semiconductor die contact, e.g., solder balls. Possible tip metals include Palladium/Nickel (Pd/Ni) alloys, Iridium/Platinum (Ir/Pt) alloys, or Rhodium (Rh).

Semiconductor region 310 contains dielectric material layers 301, 302 and 303. These dielectric material layers will form springs when the material of wafer 310 is removed (described below). In this embodiment, the set of vias closest to the tip metal (e.g., 340 and 350) will not have springs formed (thus, these vias and probe tips 390 and 395 will be exposed when the material of wafer 360 is removed).

Figure 4:
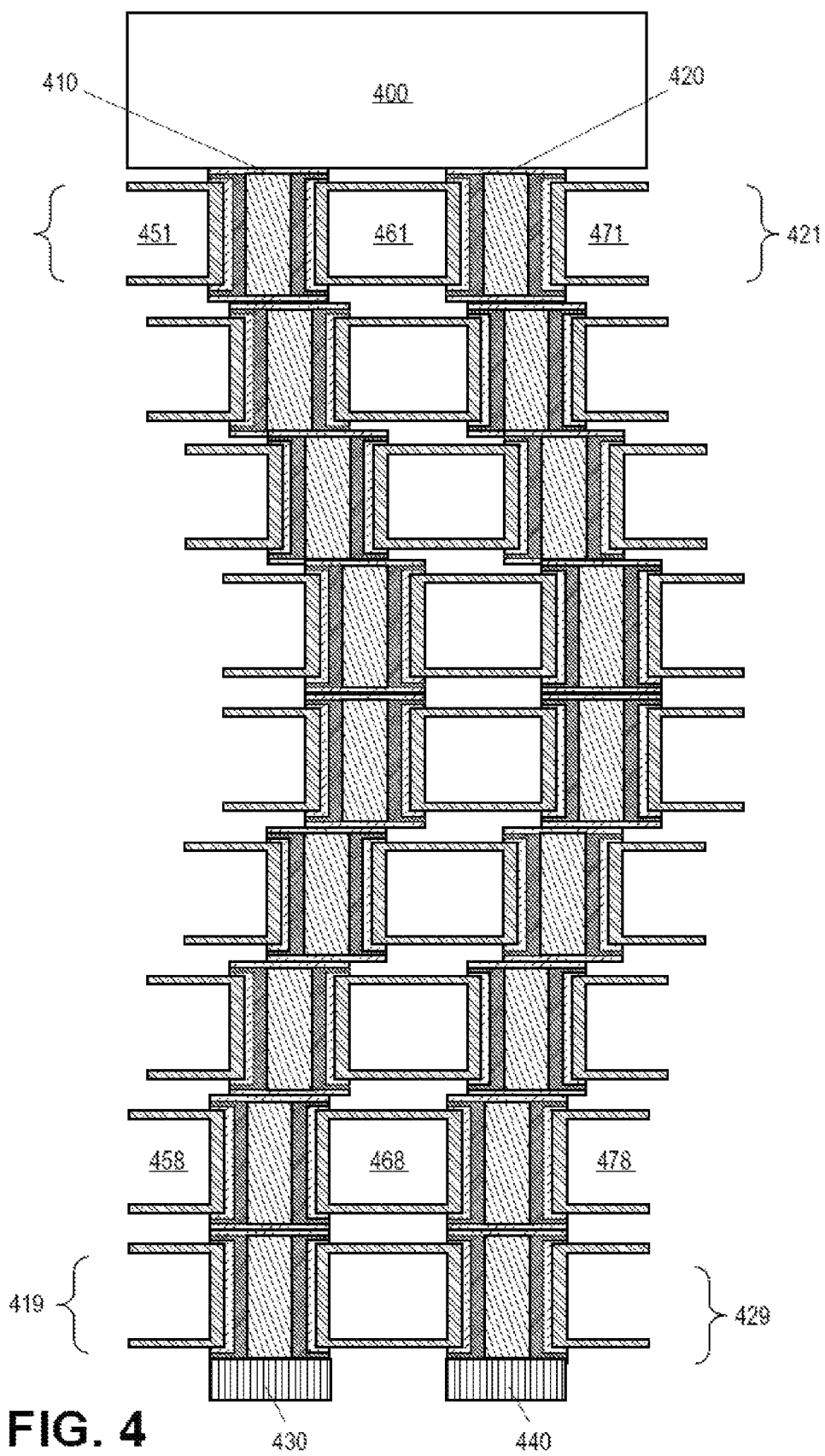
FIG. 4 illustrates an embodiment of the invention including a plurality of probes and springs.

FIG. 4 illustrates a plurality of probes and springs formed by stacking multiple semiconductor regions that include filled vias. Probes 410 and 420 are bonded to substrate 400, and include probe tips 430 and 440 respectively. Each of probe segments 411-419 and 421-429 may be formed from vias included in semiconductor regions, as described above. In this embodiment, vias including said probe segments were stacked in a lateral offset fashion to form curved probes 410 and 420. In another embodiment, vias may be stacked with a lateral and depth offset to produce spiraled probes.

Springs 461-468 (and springs 451-458 and 471-478, coupled to probes not illustrated) would be formed by removing the semiconductor material of the regions that included probe segments 411-419 and 421-429. For example, if the semiconductor region comprises silicon, a chemical process using Xenon Difluoride (XeF2) may be used to selectively remove the silicon. For glass regions, a Hydrogen Fluoride (HF) based chemical wet etch or HF vapor etch may be used to selectively remove the glass. The dielectric material used for springs may be any of the examples described above (said examples are resistant to the example processes used to remove semiconductor material from the regions). Each of springs 461-468 (as well as springs 451-458 and 471-478) may vary in thickness to provide different compliance levels for each corresponding level of probe segments.

It is to be understood that embodiments of the invention described above may be used as test probes to transmit a signal voltage from a circuit under test to an electronic test instrument. For example, probes may be used to transmit a signal voltage to test instruments such as an oscilloscope, logic analyzer, voltmeter, or ammeter, among others. Said test probes may be operatively coupled to the circuit under test and the electronic test instrument via any suitable coupling means (e.g., transmission circuitry, data channels).

Figure 5C:
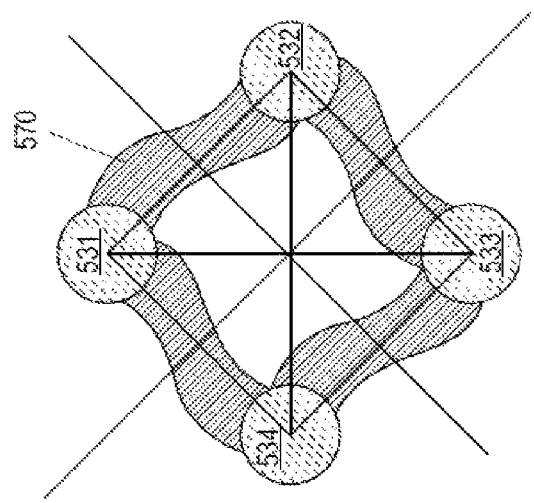
FIGS. 5a-c illustrates varying thickness of spring layers to provide varying levels of compliance.
Figure 5B:
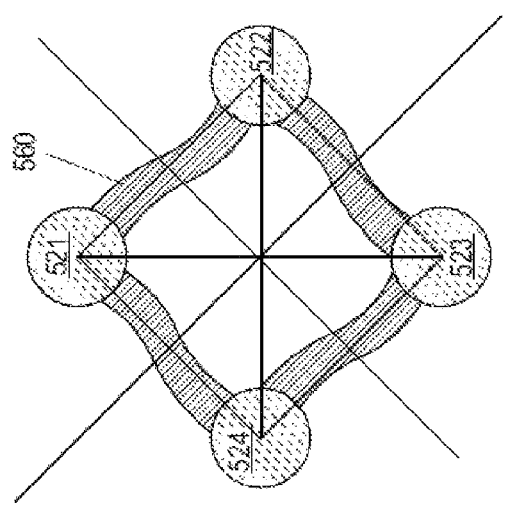
Figure 5A:
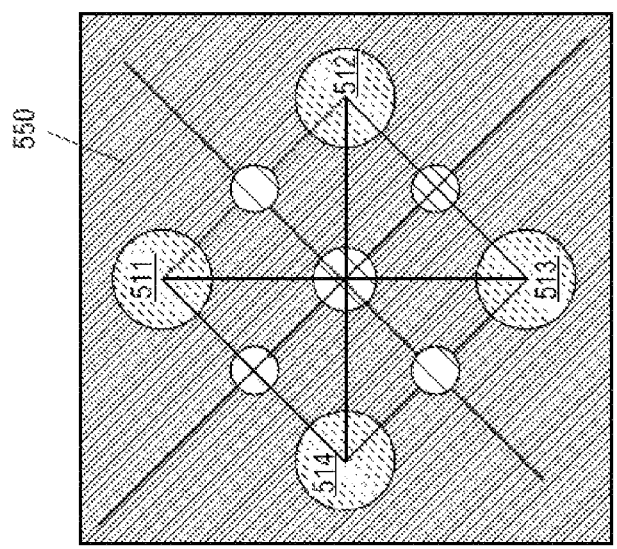

FIGS. 5a-c illustrates varying thickness of spring layers to provide varying levels of compliance. FIG. 5a illustrates an example of a "hard spring." In this example, blanket dielectric film 550 is deposited on a sacrificial wafer region including vias 511-514 to form a hard spring. Hard springs may be suitable for providing "global compliance" for the probes that will eventually include filled vias 511-514. Global compliance is important for compensation of silicon surface height sensing error and accommodating long wavelength co-planarity issues. In one embodiment, hard springs for global compliance are formed on probe segments furthest from the probe tip.

FIG. 5b illustrates an example of a "soft spring." In this example, a relatively narrow dielectric film 560 (compared to that of dielectric film 550) is deposited on a sacrificial wafer region including vias 521-524 to form a soft spring. Soft springs may be suitable for providing local compliance for each probe. Probe tips may come into contact with surfaces, e.g., solder bumps, that have variances in dimensions. Local compliance allows for individual probes to have vertical relative movement freedom. In one embodiment, soft springs are formed on probe segments closest to the probe tip.

FIG. 5c. illustrates an example of a "mid-compliance" spring. In this example, dielectric film 570 having a width between film 550 and 560 may be deposited on the sacrificial wafer region including vias 531-534 to form a mid-compliance spring. Mid-compliance springs may be suitable as a transition between global and local compliance. In one embodiment, the thickness of dielectric film 570 varies as probe segments get further from global springs and closer to soft springs.

Figure 6:
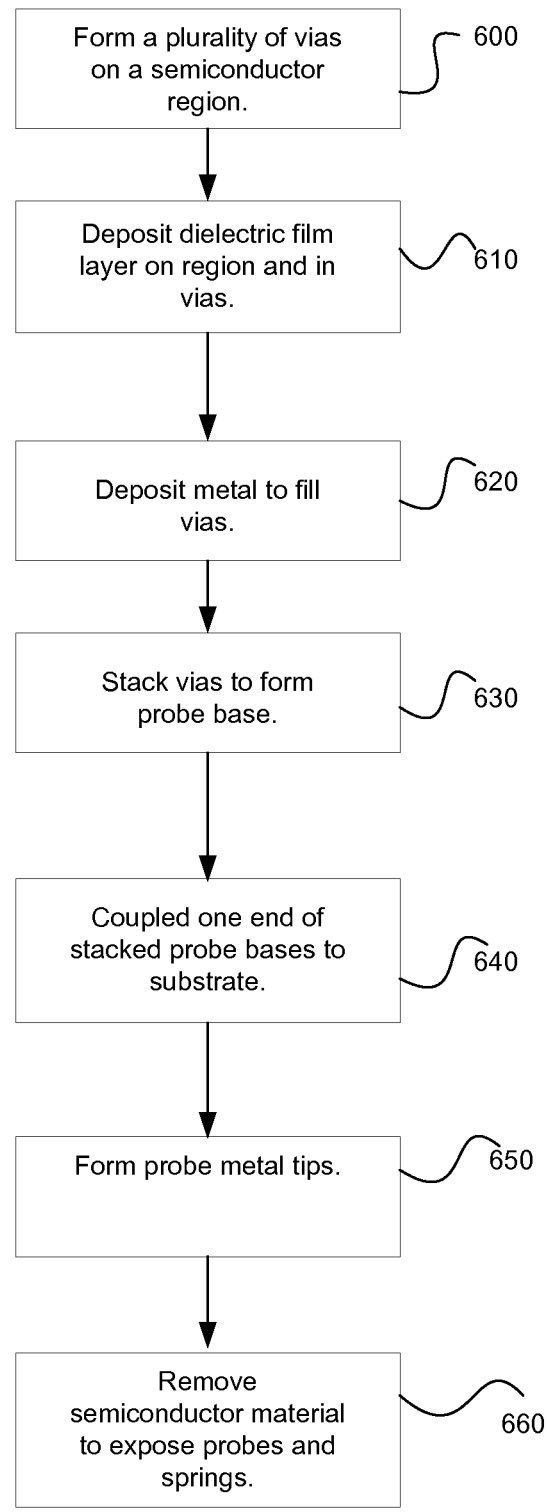
FIG. 6 is a flow diagram of a process describing an embodiment of the invention.

FIG. 6 is a flow diagram of a process describing an embodiment of the invention. Flow diagrams as illustrated herein provide examples of sequences of various process actions. Although shown in a particular sequence or order, unless otherwise specified, the order of the actions can be modified. Thus, the illustrated implementations should be understood only as examples, and the illustrated processes can be performed in a different order, and some actions may be performed in parallel. Additionally, one or more actions can be omitted in various embodiments of the invention; thus, not all actions are required in every implementation. Other process flows are possible.

A plurality of vias may be formed on a semiconductor region, 600. In one embodiment, the semiconductor region is a wafer of silicon material, and the plurality of vias are thru-silicon vias (TSVs) that may be formed by any means known in the art. A dielectric film may be deposited in each of the plurality of vias and on the wafer, 610. Segments of this dielectric film may form probe springs. A metal layer may be deposited to fill the plurality of vias, 620. These filled vias will form probe segments.

Additional wafers may be subject to the processing operations discussed above. A plurality of wafers including filled vias and dielectric film segments may be stacked to form a set of probe bases, 630. One set of ends of said probe bases may be coupled to substrate, 640, while the opposing ends may be deposited with a metal tip layer to form probe tips, 650.

The wafer material may be removed to expose the dielectric layer to form springs between each probe (i.e., probe base and tip), 660. In one embodiment, springs exists on between every level of probe segments except the probe segments including the probe tips. In one embodiment, a hard spring is disposed between the probe segments closest to the substrate, and progressively thinner springs are disposed between the remaining probe segments.

Embodiments of the invention have been described in language specific to structural features and/or methodological acts. It is to be understood that claimed subject matter may not be limited to the specific features or acts described. Rather, the specific features and acts are disclosed as sample forms of implementing the claimed subject matter.

Having thus described in detail embodiments of the invention, it is to be understood that the invention defined by the appended claims is not to be limited by particular details set forth in the above description, as many apparent variations thereof are possible without departing from the spirit or scope thereof.

The invention claimed is:

1. An apparatus comprising:
a first set of probe segments, formed from a first plurality of vias on a first semiconductor region comprising a material;
a second set of probe segments, formed from a second plurality of vias on a second semiconductor region comprising the material, bonded to the first set of probe segments;
at least one spring comprising a dielectric material to couple the first set of probe segments; and
a set of metal tips disposed on the second set of probe segments;
wherein the first and second set of probe segments each include a core comprising copper, and wherein the metal tips disposed on the second set of probe segments comprise at least one of palladium, nickel, iridium, platinum, or rhodium.

2. The apparatus of claim 1, wherein the second set of probe segments are aligned with the first set of probe segments.

3. The apparatus of claim 1, wherein the second set of probe segments are offset with respect to the first set of probe segments.

4. The apparatus of claim 1, wherein the semiconductor region comprises a wafer, and the material of the wafer comprises at least one of silicon or glass.

5. The apparatus of claim 1, wherein the dielectric material comprises at least one of silicon nitride (SiN), silicon dioxide (SiO2), silicon carbide (SiC), aluminum oxide (Al2O3), and or Chemical Vapor Deposition (CVD) diamond.

6. A system comprising:
an electronic test instrument, including a plurality of data channels; and
a set of probes to transmit voltage signals to the electronic test instrument through the plurality of data channels, the set of probes comprising
a first set of probe segments, formed from a first plurality of vias on a first semiconductor region comprising a material,
a second set of probe segments, formed from a second plurality of vias on a second semiconductor region comprising the material, bonded to the first set of probe segments,
at least one spring comprising a dielectric material to couple the first set of probe segments, and
a set of metal tips disposed on the second set of probe segments;
wherein the first and second set probe segments of the set of probes each include a core comprising copper, and wherein the metal tips disposed on the second set of probe segments comprise at least one of palladium, nickel, iridium, platinum, or rhodium.

7. The system of claim 6, wherein the second set of probe segments are aligned with the first set of probe segments.

8. The system of claim 6, wherein the second set of probe segments are offset with respect to the first set of probe segments.

9. The system of claim 6, wherein the semiconductor region comprises a wafer, and the material of the wafer comprises at least one of silicon or glass.

10. The system of claim 6, wherein the dielectric material comprises at least one of silicon nitride (SiN), silicon dioxide (SiO2), silicon carbide (SiC), aluminum oxide (Al2O3), or Chemical Vapor Deposition (CVD) diamond.

* * * * *